United States Patent [19]

Wang

[11] Patent Number: 5,108,570
[45] Date of Patent: Apr. 28, 1992

[54] MULTISTEP SPUTTERING PROCESS FOR FORMING ALUMINUM LAYER OVER STEPPED SEMICONDUCTOR WAFER

[75] Inventor: Chien-Rhone Wang, Milpitas, Calif.

[73] Assignee: Applied Materials, Inc., Santa Clara, Calif.

[21] Appl. No.: 502,362

[22] Filed: Mar. 30, 1990

[51] Int. Cl.⁵ .............................................. C23C 14/34
[52] U.S. Cl. ............................ 204/192.3; 204/192.15
[58] Field of Search ........... 204/192.15, 192.3, 298.06, 204/298.08, 298.09, 192.12

[56] References Cited

U.S. PATENT DOCUMENTS

| | | | |
|---|---|---|---|
| 4,756,810 | 7/1988 | Lamont, Jr. et al. | 204/192.3 |
| 4,810,342 | 3/1989 | Inoue | 204/192.15 X |
| 4,816,126 | 3/1989 | Kamoshida et al. | 204/192.3 |
| 4,865,712 | 9/1989 | Mintz | 204/298 |

*Primary Examiner*—Nam X. Nguyen
*Attorney, Agent, or Firm*—John P. Taylor

[57] ABSTRACT

A multistep aluminum sputtering process is disclosed wherein aluminum is sputtered onto the surface of a semiconductor wafer and low areas between closely spaced apart raised portions on the wafer, such as closely spaced apart steps, narrow trenches, or small diameter vias, are completely fulled in by the sputtered aluminum. This results in the formation of an aluminum layer which is not thinned out in such low areas, and which has a surface which ranges from substantially planar to a positive slope, such as shown at 24' and 26' in FIG. 2. The first step is carried out by sputtering from about 200 to about 2000 Angstroms of aluminum while the wafer temperature is within a range of from about 50° C. to about 250° C. and the sputtering plasma is at a power of from about 1 to about 16 kilowatts. The power level range is then changed to from about 14 to about 20 kilowatts, a DC or AC bias is applied to the wafer, and aluminum is then sputtered either for an additional time period of about 20 to about 40 seconds or until the wafer temperature reaches 500° C., whichever occurs first, in a second step. Then the back side of the wafer is contacted by a thermally conductive gas to control the wafer temperature while further aluminum is optionally sputtered onto the wafer for an additional 0 to 45 seconds in a third step.

20 Claims, 4 Drawing Sheets

---

FORMING AN ALUMINUM LAYER WITH A SUBSTANTIALLY PLANAR SURFACE ON A STEPPED SEMICONDUCTOR WAFER USING A THREE STEP SPUTTERING PROCESS

FIRST SPUTTERING UP TO 2000 ANGSTROMS OF ALUMINUM ONTO THE SEMICONDUCTOR WAFER AT A POWER LEVEL OF ABOUT 1 TO ABOUT 16 KILOWATTS AND A TEMPERATURE OF FROM ABOUT 50° C TO ABOUT 250° C

THEN SPUTTERING ALUMINUM ONTO THE WAFER AT A POWER LEVEL OF FROM ABOUT 14 TO ABOUT 20 KILOWATTS AND A WAFER TEMPERATURE OF UP TO 500° C WHILE APPLYING A DC OR AC BIAS TO THE WAFER

THEN CONTACTING THE WAFER WITH A THERMALLY CONDUCTIVE GAS WHILE OPTIONALLY SPUTTERING ADDITIONAL ALUMINUM ONTO THE WAFER WITHIN THE SAME POWER LEVEL RANGE, TEMPERATURE RANGE, AND THE SAME WAFER BIAS RANGE

```
┌─────────────────────────────────────────┐
│      FORMING AN ALUMINUM LAYER          │
│     WITH A SUBSTANTIALLY PLANAR         │
│          SURFACE ON A STEPPED           │
│      SEMICONDUCTOR WAFER USING          │
│     A THREE STEP SPUTTERING PROCESS     │
└─────────────────────────────────────────┘
                    │
┌─────────────────────────────────────────┐
│   FIRST SPUTTERING UP TO 2000 ANGSTROMS │
│    OF ALUMINUM ONTO THE SEMICONDUCTOR   │
│    WAFER AT A POWER LEVEL OF ABOUT 1 TO │
│   ABOUT 16 KILOWATTS AND A TEMPERATURE  │
│     OF FROM ABOUT 50° C TO ABOUT 250° C │
└─────────────────────────────────────────┘
                    │
┌─────────────────────────────────────────┐
│     THEN SPUTTERING ALUMINUM ONTO THE   │
│    WAFER AT A POWER LEVEL OF FROM ABOUT │
│    14 TO ABOUT 20 KILOWATTS AND A WAFER │
│       TEMPERATURE OF UP TO 500° C WHILE │
│      APPLYING A DC OR AC BIAS TO THE WAFER │
└─────────────────────────────────────────┘
                    │
┌─────────────────────────────────────────┐
│       THEN CONTACTING THE WAFER WITH A  │
│        THERMALLY CONDUCTIVE GAS WHILE   │
│          OPTIONALLY SPUTTERING ADDITIONAL │
│        ALUMINUM ONTO THE WAFER WITHIN THE │
│     SAME POWER LEVEL RANGE, TEMPERATURE │
│     RANGE, AND THE SAME WAFER BIAS RANGE │
└─────────────────────────────────────────┘
```

Figure 5

MULTISTEP SPUTTERING PROCESS FOR FORMING ALUMINUM LAYER OVER STEPPED SEMICONDUCTOR WAFER

BACKGROUND OF THE INVENTION

1. Field of the Invention

This invention relates to an improved process for forming a layer of aluminum on a semiconductor wafer. More particularly, this invention relates to a multistep sputtering process for depositing a layer of aluminum over a surface on a semiconductor wafer having closely spaced apart raised portions.

2. Description of the Related Art

In the formation of an aluminum layer by sputtering to deposit aluminum over a stepped surface, e.g., where the integrated circuit structure includes spaced lines, trenches, and/or vias or contact holes on a semiconductor wafer, where the spacing is small, e.g., the spaced lines or trench walls are less than 1.6 micrometers (microns) apart or the via diameters are less than 1.6 micrometers, aluminum layers formed by conventional sputtering processes not only are not planar, but such aluminum layers actually are thinner in the regions between such closely spaced apart raised portions, i.e., between steps or trench walls or over the vias.

This is thought to be due to a shadowing effect wherein the raised portions or steps on either side of the narrow regions prevent or inhibit deposition of the sputtered atoms from reaching such regions unless the atom reaches the wafer from a path which is nearly perpendicular to the wafer. That is, sputtered atoms traveling at an angle toward the wafer encounter the raised steps, or sidewalls of the trench or via, and deposit thereon without reaching the low regions on the wafer between such closely or narrowly spaced apart raised portions.

FIG. 1, which is illustrative of the results obtained using such prior art processes, shows the effects of shadowing when steps on a semiconductor wafer are closely spaced apart. A semiconductor wafer 10 is shown having steps 11, 12, and 13 formed on the wafer prior to the sputtering of an aluminum layer 20 thereon. Aluminum layer 20 does not fill narrow region 14 between closely spaced apart steps 11 and 12, but rather only forms a thin layer portion 22 which is thinner than the remainder of aluminum layer 20, because region 14 is shadowed by the adjacent high steps 11 and 12. In contrast, the wider region 16 between steps 12 and 13, which are not closely spaced apart, is completely filled with aluminum which, as seen at 24, is not thinner than the remainder of layer 20, presumably because there is no shadowing effect here as there is in region 14.

In addition to the difference in thickness between the aluminum deposited in regions 14 and 16, it will be noted that aluminum layer 20 forms a thin layer at 26 on the sidewalls of narrow region 14 and that aluminum layer 20 then gradually slopes inwardly, in what made be termed a "negative" slope, to define an overhang or inward necking of aluminum layer 20 at 28 in prior art FIG. 1. While this effect will also be noted slightly in aluminum layer 20 at 24 over region 16 in FIG. 1, the effect over such wide regions is negligible. However, this negative slope effect in regions between closely spaced apart raised portions of a semiconductor wafer, such as shown over region 14 in FIG. 1, can result in the formation of voids in the aluminum layer as well as add to the shadowing effect by further hindering the passage of sputtered aluminum into region 14.

Since integrated circuit structures formed on semiconductor wafers are becoming smaller and smaller with finer features, including thinner lines, smaller line pitches, and smaller contact holes, it is important to be able to overcome this shadowing effect and negative slope deposition of aluminum in low areas between closely spaced apart raised portions of a semiconductor wafer; and to be able to sputter an aluminum layer on a wafer surface containing closely spaced apart raised portions, which will not form such thin films or layers in the regions between the closely spaced apart raised portions of the integrated circuit structure, but will rather substantially completely fill in such low areas between closely spaced apart raised portions of a semiconductor wafer and which will not form negative slopes during the aluminum deposition.

SUMMARY OF THE INVENTION

It is, therefore, an object of this invention to provide an improved process for sputtering an aluminum layer on a semiconductor wafer having closely spaced apart raised portions which will substantially completely fill in low areas between such closely spaced apart raised portions on the wafer and which will not form negative slopes during the aluminum deposition.

It is another object of this invention to provide an improved process for sputtering an aluminum layer on a semiconductor wafer having closely spaced apart raised portions using a multistep process wherein an aluminum layer not exceeding about 2000 Angstroms is sputtered onto a wafer in a first step while maintaining the wafer at a temperature not exceeding about 250° C. and a plasma power level of from about 1 to about 16 kilowatts; and then, in a second sputtering step, the plasma power level is changed to from about 14 to about 20 kilowatt, a DC or AC bias voltage is applied to the wafer, and the aluminum sputtering is then continued for about 20 to about 45 seconds or until the wafer temperature rises to a temperature not exceeding about 500° C., whereby low areas between closely spaced apart raised portions on the wafer will be substantially completely filled in and negative slopes will not be formed.

It is yet another object of this invention to provide an improved process for sputtering an aluminum layer on a semiconductor wafer having closely spaced apart raised portions using a multistep process wherein an aluminum layer not exceeding about 2000 Angstroms is sputtered onto a wafer in a first step while maintaining the wafer at a temperature not exceeding about 250° C. and a plasma power level of from about 1 to about 16 kilowatts; and then, in a second sputtering step, the plasma power level is changed to from about 14 to about 20 kilowatt, a DC bias voltage of from about 100 to about 150 volts or an AC bias voltage of from about 300 to about 500 volts peak to peak, is applied to the wafer, and the aluminum sputtering is then continued for about 20 to about 45 seconds or until the wafer temperature rises to a temperature not exceeding about 500° C., whereby low areas between closely spaced apart raised portions on the wafer will be substantially completely filled in and negative slopes will not be formed.

It is a further object of this invention to provide an improved process for sputtering an aluminum layer on a semiconductor wafer having closely spaced apart raised portions using a multistep process wherein an aluminum layer not exceeding about 2000 Angstroms is sputtered onto a wafer in a first step while maintaining the wafer at a temperature not exceeding about 250° C. and a plasma power level of from about 1 to about 16 kilowatts; and then, in a second sputtering step, the plasma power level is changed to from about 14 to about 20 kilowatt, a DC bias voltage of from about 100 to about 150 volts, or an AC bias voltage of from about 300 to about 500 volts peak to peak, and a power level of from about 400 to about 1000 watts is applied to the wafer, and the aluminum sputtering is then continued for about 20 to about 45 seconds or until the wafer temperature rises to a temperature not exceeding about 500° C., whereby low areas between closely spaced apart raised portions on the wafer will be substantially completely filled in and negative slopes will not be formed.

It is yet a further object of this invention to provide an improved process for sputtering an aluminum layer on a semiconductor wafer having closely spaced apart raised portions using a multistep process wherein an aluminum layer not exceeding about 2000 Angstroms is sputtered onto a wafer in a first step while maintaining the wafer at a temperature not exceeding about 250° C. and a plasma power level of from about 1 to about 16 kilowatts; and then, in a second sputtering step, the plasma power level is changed to from about 14 to about 20 kilowatt, a DC bias voltage of from about 100 to about 150 volts, or an AC bias voltage of from about 300 to about 500 volts peak to peak, is applied to the wafer, and the aluminum sputtering is then continued for about 20 to about 45 seconds or until the wafer temperature rises to a temperature not exceeding about 500° C. at which time, in a third sputtering step, the backside of the wafer is contacted with a thermally conductive gas to thermally couple the wafer to the wafer support to stabilize the temperature of the wafer while aluminum optionally continues to be sputtered onto the wafer surface for from about 0 to about 45 seconds further, whereby low areas between closely spaced apart raised portions on the wafer will be substantially completely filled in and negative slopes will not be formed.

These and other objects of the invention will be apparent from the following description and accompanying drawings.

BRIEF DESCRIPTION OF THE DRAWINGS

FIG. 5 is a flow sheet illustrating the process of the invention.

DETAILED DESCRIPTION OF THE INVENTION

Figure 1:
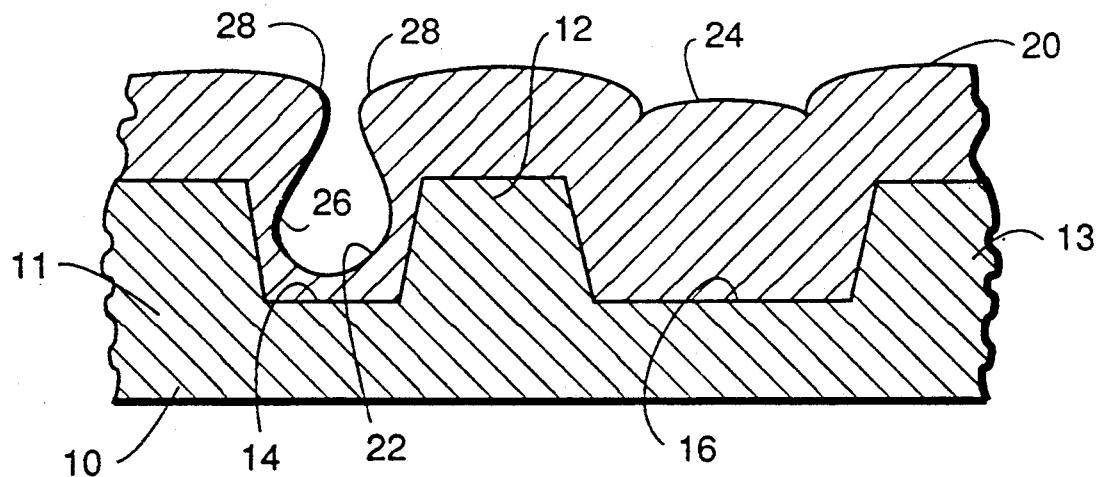
FIG. 1 is a fragmentary vertical cross-sectional view of an aluminum layer sputtered by a prior art process onto a semiconductor wafer having closely spaced apart steps thereon.
Figure 2:
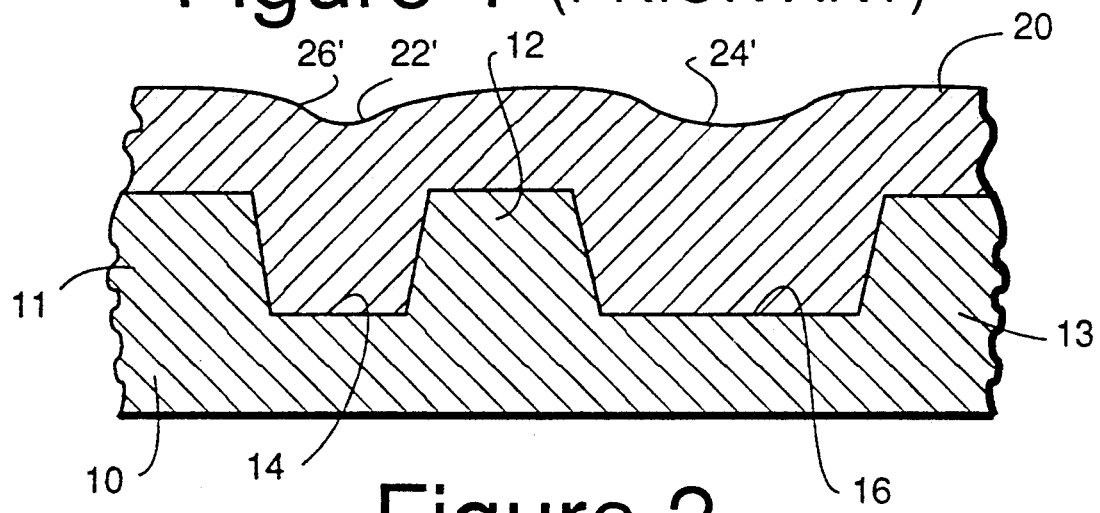
FIG. 2 is a fragmentary vertical cross-sectional view of an aluminum layer sputtered by the process of the invention onto a semiconductor wafer having closely spaced apart steps thereon.

In accordance with the invention, an aluminum layer is sputtered onto the surface of a semiconductor wafer using a multistep process whereby, as shown at 22' in FIG. 2, regions between closely spaced apart steps on the wafer are substantially completely filled in, in contrast to the results of the prior art process shown in FIG. 1. Furthermore, deposition of the aluminum layer will not result in a surface having a negative slope, such as shown at 26 in prior art FIG. 1, but rather the aluminum will deposit to form a layer ranging from a substantially planar layer to a positive slope such as shown at 24' and 26' in FIG. 2.

By use of the term "closely spaced apart raised portions" herein is meant raised portions on a semiconductor wafer, such as raised lines, or the opposite walls of a trench, or the sidewalls of a via, wherein the aspect ratio between the height of such raised portions or walls over the width of the low areas therebetween ranges from about 0.625 (1/1.6) to at least about 1, and in some instances as high as 2 when the walls are tapered.

Figure 1A:
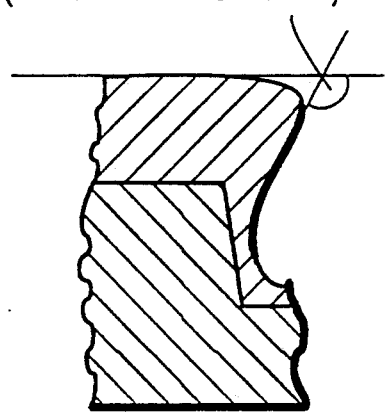
FIG. 1A is a fragmentary vertical cross-sectional view of a portion of FIG. 1, with numerals omitted for clarity, showing the greater than 90° angle which the aluminum layer in the low region 14 of FIG. 1 defines with the remainder of the aluminum layer, referred to as a "negative slope".
Figure 2A:
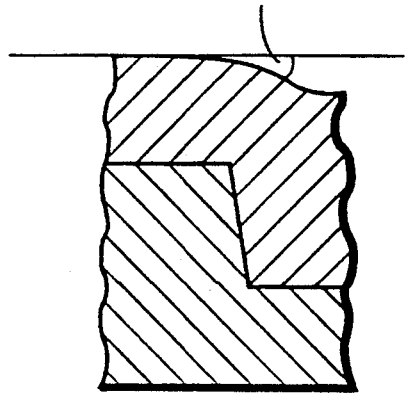
FIG. 2A is a fragmentary vertical cross-sectional view of a portion of FIG. 2, with numerals omitted for clarity, showing the less than 90° angle which the aluminum layer in the low region 14 of FIG. 2 defines with the remainder of the aluminum layer referred to as a "positive slope".

The terms "negative slope" and "positive slope" as used herein in describing the surface of the aluminum layer sputtered on a semiconductor wafer in accordance with the invention, refers to the angle which the surface of the aluminum layer over a low region of the semiconductor wafer between closely spaced apart raised portions of the wafer defines with respect to the remainder of the surface of the aluminum layer. When the angle is over 90°, as shown at 26 in FIG. 1 and in FIG. 1A, the slope is referred to as a "negative slope", while an angle of less than 90°, as shown in FIGS. 2 and 2A, will be referred to as a "positive slope".

The sputtered aluminum layer formed by the process of the invention may be pure aluminum, e.g., 99.9+wt.% aluminum, or it may comprise an aluminum alloy containing up to about 1.5 wt.% silicon or up to about 2 wt.% copper or a mixture of both within these specified limits. It will, therefore, be understood that the use of the term "aluminum" herein is intended to include both pure aluminum and aluminum alloyed with either silicon or copper or both within the limits described.

a) Sputtering Apparatus

Figure 3:
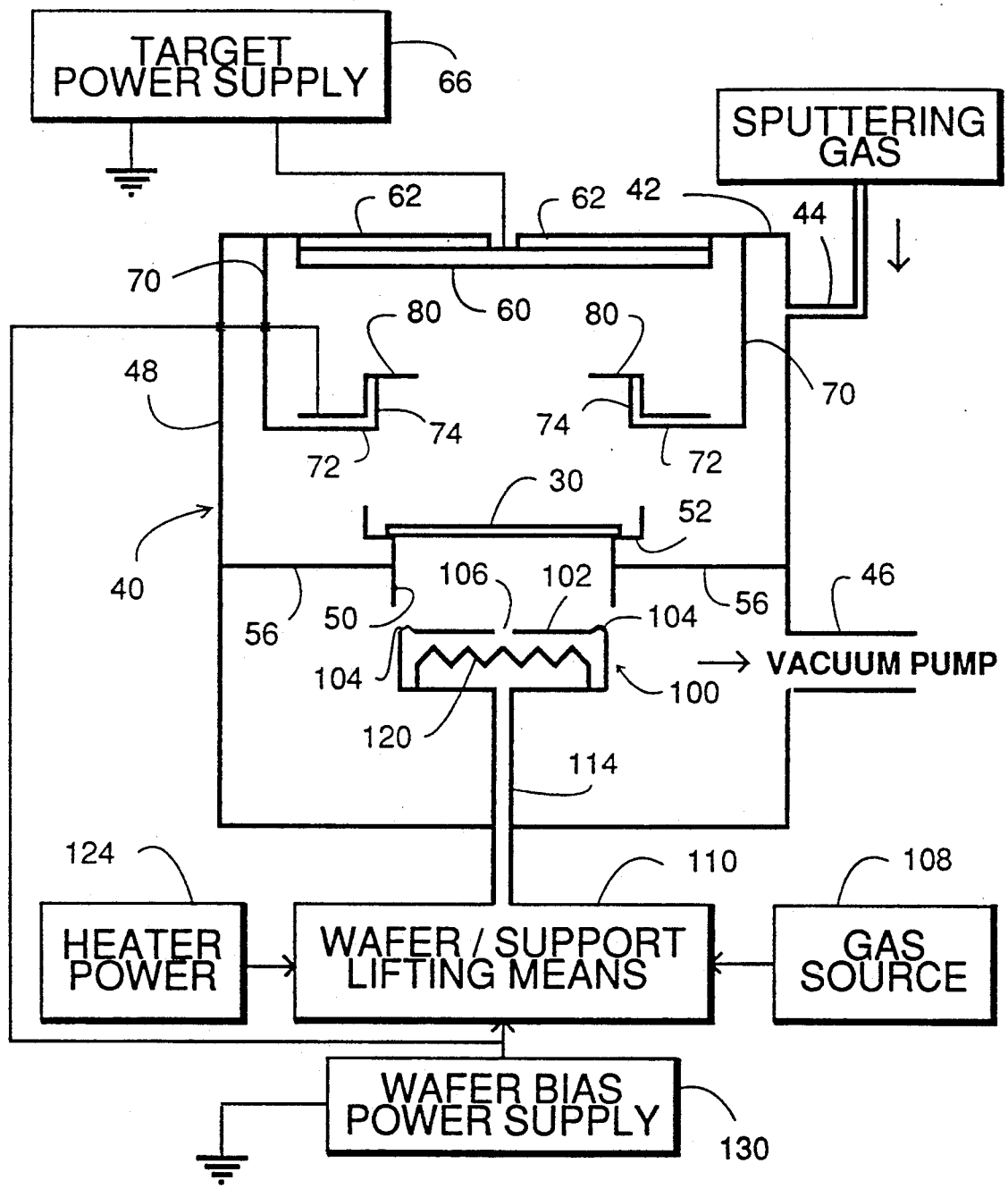
FIG. 3 is a vertical cross-sectional view of a sputtering chamber used in the process of the invention, showing the wafer just after loading it into the chamber and prior to raising it to the sputtering position.
Figure 4:
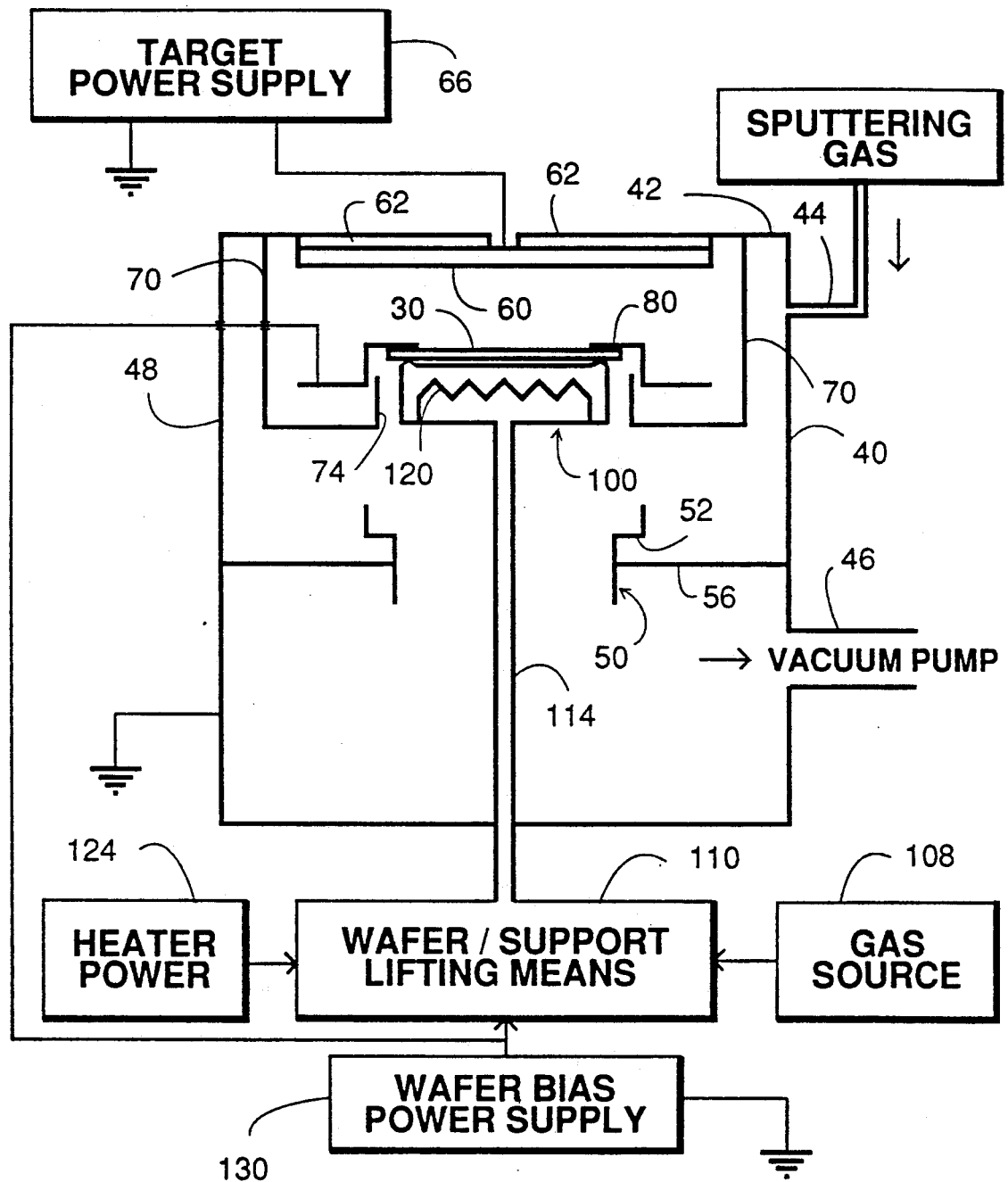
FIG. 4 is a vertical cross-sectional view of the same sputtering chamber shown in FIG. 3, but with the wafer raised to a position where the sputtering process can commence

Typical sputtering apparatus which may be used to carry out the process of the invention is shown in FIGS. 3 and 4. A wafer 30 is initially inserted into a sputtering chamber 40 comprising top wall 42 and sidewalls 48 and placed on a wafer support member such as the cylindrical or ring shaped support member 50 shown in FIGS. 3 and 4 which is provided with an enlarged upper flange 52 of suitable diameter to provide a support for wafer 30. Support member 50 may be mounted to the walls of chamber 40 by pins or brackets 56.

Chamber 40 is further provided with a sputtering gas inlet port 46 connected to a source of a sputtering gas such as argon (not shown) which is flowed into chamber 40 at a rate of from about 30 standard cubic centimeters/minute (sccm) to about 300 sccm. An outlet port 48 in chamber 40 is connected to vacuum pump means (not shown) to maintain a pressure within sputtering chamber 40 within a range of from about 1 to about 8 milliTorr.

Mounted to top wall 42 of chamber 40 is an aluminum target 60 which is insulated from the grounded walls 48 of chamber 40 by insulators 62. Target 60 is electrically connected to the negative terminal of a power supply 66 having an adjustable (resetable) power level.

Surrounding target 60 and mounted to top wall 42 of chamber 40 is a cylindrical shield member 70 which is provided with a lower flange or shoulder 72 and an upwardly extending inner lip 74 which carries a clamping ring 80 to engage the edges of the top surface of wafer 30, when the wafer is raised to the sputtering position, to seal wafer 30 to a circular wafer support platform 100 for a purpose which will be explained below.

Wafer support platform 100 is shown in FIG. 3 in a position below wafer 30 to facilitate initial loading of wafer 30 into chamber 10. However, as shown in FIG. 4, platform 100 is used to lift wafer 30 off of wafer support 50 and into position within shield 70 and beneath target 60 to permit the sputter deposition of an aluminum layer on wafer 30. Wafer support platform 100 also serves as a heating means, a heat stabilizing means, and a biasing means for wafer 30.

Platform 100 is initially raised to a position where it lifts wafer 30 from cylindrical support 50 via lifting means 110 which may, for example, comprise a fluid power cylinder coupled to platform 100 via a hollow shaft or rod 114.

Platform 100 also contains heating means 120 comprising an electrical resistance heater electrically connected through hollow shaft 114 to a heater power supply 124. Heater means 120 serves to initially heat wafer 30 when the sputter deposition process is commenced. Platform 100 may be further provided with cooling means such as water cooling coils (not shown) to further stabilize the temperature of platform 100.

To stabilize the temperature of wafer 30 during a portion of the sputtering process of the invention, platform 100 is further provided with a crown 104 adjacent the edge of the convex top surface 102 of platform 100 which cooperates with clamping ring 80 to seal the edges of the back surface of wafer 30 to top surface 102 of platform 100, thereby defining a sealed chamber having a thickness of about 1 to about 2 microns between the back surface of wafer 30 and top surface 102 into which a thermally conductive gas, such as argon, may be admitted though opening 106 in top surface 102 during a portion of the process as will be described below.

The thermally conductive gas, which is supplied from a gas source 108 through hollow shaft 114, serves to thermally couple wafer 30 to platform 100. As excess heat builds up in wafer 30 during the sputtering process, such heat is transmitted through the gas from wafer 30 to platform 100 which is much more massive than the wafer and therefore acts as a large heat sink to absorb the additional heat as it is generated.

The wafer also may be electrically biased, with respect to the grounded chamber, through platform 100 and clamping ring 80, from a biasing power supply 130. The bias may be a DC or AC bias applied to wafer 30, as will be described below.

b) First Deposition Step of the Process

The multistep sputtering process of the invention is carried out by first sputtering aluminum onto the wafer surface for a period of time sufficient to form an initial aluminum layer having a thickness ranging from about 200 to about 2000 Angstroms in thickness. The purpose of this step is to form a conductive surface over the semiconductor wafer on which the aluminum layer is being sputtered to permit the wafer surface to be subsequently electrically biased with an AC or DC bias during the second deposition step as will be explained below. It has been found that if a conductive layer of aluminum is not formed in a step prior to subsequent use of such AC or DC bias, arcing can occur with the use of DC bias and discontinuous films may be formed with AC bias. Thus, this first deposition step serves merely to form a thick enough layer of conductive material to permit the subsequent deposition step or steps to function in the intended manner.

During this first deposition step, the temperature of the wafer is maintained within a temperature range of from about 50° C. to about 250° C., preferably about 50° C. to about 200° C., and most preferably from about 50° C. to about 150° C.

The target power supply is set at a voltage of about $-400$ to about $-600$ volts, more preferably from about $-450$ to about $-550$ volts, and most preferably about $-500$ volts; and at a power level of from about 1 kilowatt to about 16 kilowatts.

The pressure within the sputtering chamber, during this first sputtering step, as well as throughout the remainder of the process, is maintained within a range of from about 1 milliTorr to about 8 milliTorr while a sputtering gas such as argon is flowed into the sputtering chamber at a rate of from about 30 standard cubic centimeters/minute (sccm) to about 300 sccm.

To carry out the first step of the sputtering deposition process of the invention, the wafer is initially loaded onto support ring 50 from a load lock vacuum chamber and chamber 40 is evacuated down to at least about $10^{-7}$ Torr. Before insertion of wafer 30 into chamber 40, heater means 120 in platform 100 has already heated platform 100 to from about 250° C. to about 450° C. After insertion of wafer 30 into chamber 40 and onto ring 50, and before raising platform 100, an optional time interval of from 0 to 60 seconds may be used to provide an initial heating, by radiation, of wafer 30.

Platform 100 is then raised to contact wafer 30 and to remove it from ring 50 to the position shown in FIG. 4. The platform is maintained in contact with wafer 30 for a period of from about 5 to about 120 seconds to raise the wafer temperature up to the desired range by heat radiating from the heater within platform 100 prior to commencement of the first deposition step.

It should be noted here that no heat conducting gas is admitted to the area defined between top surface 102 of wafer support platform 100 and the backside of the wafer at this step of the process because this would cause the wafer temperature to rise to a point higher than desired because of the more efficient heat transfer between the wafer and the heater which would occur if the heat conductive gas were to be utilized at this step in the process.

The reason that the heater is maintained at a temperature hotter than the desired wafer temperature during the first step of the process is that the heater temperature must be at a higher temperature during subsequent steps in the process and it would be impossible to maintain the heater at a lower temperature during the first step of the process and then heat it further prior to the second or third steps, given the speed of the steps of the invention. Thus, the heater is rather maintained at the same temperature, i.e., from about 250° C. to about 450° C., during the entire process and the short contact time during the first step, as well as the use of radiant heat transmission, rather than conductive heat coupling or transmission, accomplishes the desired purpose of maintaining the wafer temperature lower during the first deposition step than the temperature during the remainder of the process.

The first step of the deposition process then begins by flowing a sputtering gas such as argon into the chamber within the previously discussed flow range and igniting a plasma between target 60 and the grounded portions of chamber 40 exposed to target 60, principally shield 70, while maintaining chamber 40 at the desired pressure range of from about 1 milliTorr to about 8 milliTorr. This first deposition step is then carried out until the desired initial aluminum layer thickness of from about 200 to about 2000 Angstroms has been deposited on the wafer.

c) Second Deposition Step

The second deposition step is carried out for a period of from about 15 to about 45 seconds. This step is basically limited by wafer temperature, rather than either time or power level, with the maximum wafer temperature not to exceed about 500° C., and preferably not to exceed about 400° C. Therefore, plasma power levels ranging from about 14 kilowatts up to about 20 kilowatts may be used as long as the maximum wafer temperature limit is not exceeded. Voltage levels used in the plasma power supply may be maintained at the same level as in the first step. If the wafer temperature approaches the maximum wafer temperature, as the sputtering proceeds, the second step is terminated and the third step is commenced.

In accordance with the invention, to provide for the uniform deposition of the sputtered aluminum on the wafer surface, including low regions between closely spaced apart raised portions of the wafer, a bias voltage is applied to the wafer, with respect to the grounded walls of the deposition chamber 40 and shield 70, using wafer bias power supply 130 which is connected to wafer 30 through both wafer support platform 100 and clamping ring 80.

The bias applied to wafer 30 may be either a DC bias or an AC bias. When a DC bias is applied to wafer 30, a negative bias of from about −100 to −150 volts DC should be applied to wafer 30 at a power level of from about 400 to about 1000 watts. When an AC bias is applied to wafer 30, a peak to peak voltage of about 300 to about 500 volts is used at a frequency ranging from about 50 KiloHertz up to about 500 KiloHertz at a power level which again will range from about 400 to about 1000 watts. With respect to the power level, it should be noted that the bias on the wafer causes a current to flow between the grounded portions of the sputtering chamber, including grounded chamber walls 48 and shield 70, and wafer 30 and clamping ring 80 through the ionized gases in the chamber. Therefore, changes in the geometry of the chamber and/or the shield, as well as changes in the size of the wafer and/or the clamping ring, will affect the total current flow and, therefore, the amount of power consumed by the biasing of wafer 30.

When the wafer temperature reaches about 500° C., preferably about 400° C., the second step of the sputtering process of the invention is terminated. This end point for the second step may be determined either by monitoring the wafer temperature or by timing the second step to end at a predetermined point within the previously discussed time period which has been empirically determined to result in a wafer temperature which does not exceed the 500° C. maximum.

d) Optional Third Deposition Step

When the second step of the sputtering process of the invention has been terminated, the third step is commenced which comprises flowing a thermally conductive gas such as argon into the sealed region between wafer 30 and surface 102 of platform 100. This thermally couples wafer 30 to platform 100 to thereby limit further increases in the wafer temperature. The sputtering process is then optionally continued, at the same power level and wafer bias, for an additional period of from 0 to about 45 seconds.

This third step of the process is also controlled or limited by wafer temperature with the maximum wafer temperature again not to exceed the maximum temperatures listed above for the second step. If need be, the power level may be reduced during this third step to maintain the wafer temperature within the recited limits. Usually, however, the power level will not be reduced below about 14 kilowatts during this third step.

It should be noted that both the sputtering power and the bias voltage on the wafer may be adjusted during either the second step or the third step, if desired to provide more accurate control of the wafer temperature, deposition rate, etc.

With respect to the optional further deposition of aluminum during the third step, i.e., after commencing the flow of the gas to the backside of the wafer to thermally couple it to the platform, the total amount of aluminum to be sputtered over the wafer will depend to some extent on the underlying topography of the wafer. The total thickness of the deposited aluminum layer over the low areas of the wafer between closely spaced apart raised portions of the wafer should be at least 80%, and preferably from about 100 to 200%, of the depth of the via or trench or height of the lines on the wafer.

Using the above procedure, an aluminum layer is deposited, which may have an average thickness of about 0.6 to about 2 microns, and usually averaging about 1.0 microns, over the highest portions of the underlying semiconductor wafer. The deposited aluminum layer substantially completely fills in the low areas between such closely spaced apart raised portions on the wafer and does not form negative slopes over such low regions of the wafer.

It should be noted, in this regard, that using the process of the invention, straight wall trenches and regions between closely spaced apart vertical raised lines having aspect ratios as high as 1.25 (height/width) can be satisfactorily filled with aluminum without experiencing the prior art thinning of the aluminum layer previously discussed, and if the walls are tapered down to an angle of about 80° or less to the horizontal, trenches and regions between raised lines having aspect ratios as high as 2 (as measured at the bottom of the trench or region between raised lines) can be satisfactorily filled with aluminum using the process of the invention.

Similarly, straight walled vias having aspect ratios as high as 1 can be satisfactorily filled using the process of the invention while tapered vias, having walls forming an angle of 70° or less to the horizontal, may be satisfactorily filled in accordance with the invention even with aspect ratios as high as 2.

To further illustrate the process of the invention, a 0.6 mm silicon wafer was loaded into a sputtering chamber such as previously described. The wafer had a series of 1 micron high and 1 micron wide silicon oxide steps formed thereon with a spacing between the steps of about 1 micron.

The sputtering chamber was then pumped down to about $3.3 \times 10^{-8}$ Torr. The target power supply was set at 2000 watts power with a $-428$ volt DC target voltage. The heater temperature was 300° C. Within approximately 1 minute after loading the wafer into the chamber, the platform was raised to move the wafer into the sputtering position. Argon gas was then flowed through the chamber at 100 sccm. The plasma was then ignited and the wafer was sputtered at this power level for about 10 seconds.

The power level of the target power supply was then reset at 18 kilowatts and a wafer bias of $-120$ volts DC was applied to the wafer through the support platform and the clamping ring. The wafer was then sputtered for an additional 30 seconds after which argon gas was admitted to the region between the backside of the wafer and the wafer support to control the wafer temperature. The sputtering process was then continued at a power level of 15 kilowatts and a wafer bias voltage of $-140$ volts DC for an additional 40 seconds. The target power supply was then shut off to stop the process.

The wafer was then removed from the chamber, sectioned, and examined under a scanning electron microscope (SEM). The low ares between the closely spaced apart steps were found to be completely filled with aluminum, with no visible evidence of void formation and the slope of the deposited aluminum layer over the low regions was positive.

Thus, the invention provides a novel aluminum sputtering process wherein regions between closely spaced apart raised portions on a semiconductor wafer may be substantially completely filled with aluminum and negative slopes on the deposited aluminum layers over low areas between closely spaced apart raised portions of the wafer may be avoided.

Having thus described the invention, what is claimed is:

1. A sputtering process for forming an aluminum layer over a stepped semiconductor wafer in a splattering chamber which comprises:
    (a) sputtering from about 200 to about 2000 Angstroms of aluminum from a target onto said wafer in a first deposition step while maintaining a power level on said target of from about 1 kilowatt to about 16 kilowatts;
    (b) providing a target power level of at least about 14 kilowatts and sputtering aluminum for an additional 25 to 45 seconds or until the wafer temperature reaches about 500° C., whichever occurs first, during a second deposition step, while applying a DC or AC bias to the wafer; and
    (c) then contacting the backside of the wafer with a thermally conductive gas to maintain said wafer at a temperature not exceeding about 500° C. while sputtering additional aluminum onto said wafer for an additional 0 to 45 seconds in a third deposition step.

2. The process of claim 1 wherein said bias is a DC bias which ranges from about $-100$ to about $-150$ volts.

3. The process of claim 2 wherein the power level of said DC bias ranges from about 400 to about 1000 watts.

4. The process of claim 1 wherein said bias is an AC bias which ranges from about 300 to about 500 volts peak to peak.

5. The process of claim 4 wherein the power level of said AC bias ranges from about 400 to about 1000 watts.

6. The process of claim 1 wherein said first step is carried out while maintaining a wafer temperature of from about 50° C. to about 250° C.

7. The process of claim 1 a voltage is maintained on said target within a range of from about $-400$ volts to about $-600$ volts throughout the process.

8. The process of claim 1 wherein said sputtering chamber is maintained at a pressure within a range of from about 1 milliTorr to about 8 milliTorr throughout the process.

9. The process of claim 1 wherein said wafer temperature is not allowed to exceed about 400° C. during said second step.

10. The process of claim 1 wherein said second step is terminated when said wafer temperature exceeds about 400° C.

11. The process of claim 1 wherein a heater is located in a wafer support platform and said heater and support platform are initially heated to a temperature of from about 250° C. to about 450° C. prior to said first sputtering step.

12. The process of claim 11 wherein said thermally conductive gas is admitted to a sealed region between the upper surface of said wafer support platform and the backside of said wafer after said second step to thermally couple said wafer to said support platform.

13. The process of claim 1 wherein said thermally conductive gas couples said wafer to a heater maintained at a temperature not exceeding 450° C.

14. A process for sputtering an aluminum layer having a substantially planar surface over a semiconductor wafer having closely spaced apart raised portions which comprises:
    (a) heating a wafer support platform in a sputtering chamber to a temperature of from about 250° C. to about 450° C.;
    (b) then raising said heated support platform to contact said wafer and move said wafer and said platform to a sputtering position in said chamber;
    (c) sputtering aluminum from a target onto said wafer for a period of time sufficient to deposit from about 200 to about 2000 Angstroms of aluminum on said wafer in a first deposition step while maintaining a power level on said target of from about 1 to about 16 kilowatts;
    (d) changing the power level to from about 14 to about 20 kilowatts and sputtering aluminum for an additional 25 to 45 seconds or until said wafer reaches a temperature not exceeding about 500° C., whichever occurs first, while applying a DC or AC bias on said wafer during a second deposition step; and (e) then contacting the backside of the wafer with a thermally conductive gas to control said wafer temperature while sputtering additional aluminum onto said wafer for an additional 0 to 45 seconds while maintaining said bias on said wafer in a third deposition step.

15. The process of claim 14 wherein said bias on said wafer during said second and third deposition steps is a DC bias of from about −100 volts to −150 volts DC.

16. The process of claim 14 wherein said bias on said wafer during said second and third deposition steps is an Ac bias which ranges from about 300 to about 500 volts peak to peak.

17. The process of claim 14 wherein said thermally conductive gas is brought in contact with said wafer at the end of said second step to thermally couple said wafer to said wafer support platform to inhibit said wafer temperature from rising about 500° C.

18. The process of claim 14 wherein the voltage on said target is maintained throughout within a range of from about −400 volts to about −600 volts.

19. The process of claim 14 wherein said sputtering chamber is maintained throughout the process at a pressure within a range of from about 1 milliTorr to about 8 milliTorr.

20. A process for sputtering an aluminum layer having a substantially planar surface over a semiconductor wafer having closely spaced apart raised portions which comprises:

(a) heating a wafer support platform in a sputtering chamber to a temperature of from about 250° C. to about 450° C.;

(c) sputtering aluminum from a target onto said wafer until from about 200 to about 2000 Angstroms of aluminum has deposited on said wafer in a first deposition step while maintaining a power level on said target of from about 1 to about 16 kilowatts and while maintaining a target voltage of from about −400 to about −600 volts;

(d) changing the target power level range to a range of from 14 to about 20 kilowatts and sputtering aluminum for an additional 25 to 45 seconds or until said wafer reaches a temperature of about 500° C., whichever occurs first, while applying either a DC bias voltage of from about −100 to about −150 volts DC, or an AC bias voltage of from about 300 to about 500 volts AC peak to peak, on said wafer during a second deposition step; and (e) then contacting the backside of the wafer with a thermally conductive gas to control said wafer temperature while sputtering additional aluminum onto said wafer for an additional 0 to 45 seconds while still maintaining said bias on said wafer in a third deposition step.

* * * * *